United States Patent [19]

Fabbri et al.

[11] Patent Number: 4,533,868
[45] Date of Patent: Aug. 6, 1985

[54] ELECTRONIC INSTRUMENT FOR MEASURING THE OVERALL PHASE AND AMPLITUDE DISTORTION OF A TRANSMISSION CHANNEL

[75] Inventors: Bruno Fabbri, Turin; Alfredo Fausone, Ivrea, both of Italy

[73] Assignee: SIP - Societa Italiana per L'Esercizio Telefonico p.A., Turin, Italy

[21] Appl. No.: 423,147

[22] Filed: Sep. 24, 1982

[30] Foreign Application Priority Data

Nov. 18, 1981 [IT] Italy .................... 68493 A/81

[51] Int. Cl.³ .............................................. G01R 23/16
[52] U.S. Cl. ................... 324/83 R; 324/77 B; 324/77 R
[58] Field of Search ............... 324/77 A, 77 B, 78 Z, 324/82, 83 R, 83 A, 79 D, 77 R; 328/155, 164

[56] References Cited

U.S. PATENT DOCUMENTS

| | | | |
|---|---|---|---|
| 3,184,606 | 5/1965 | Ovenden et al. | 324/78 Z |
| 3,500,193 | 3/1970 | Kemanis | 324/77 B |
| 3,747,106 | 7/1973 | Dalabakis et al. | 324/82 |
| 3,986,053 | 10/1976 | Dömer | 328/164 |
| 4,021,653 | 5/1977 | Sharp et al. | 324/79 D |
| 4,128,808 | 12/1978 | Westra | 324/79 D |

Primary Examiner—Ernest F. Karlsen
Assistant Examiner—S. Baker
Attorney, Agent, or Firm—Karl F. Ross; Herbert Dubno

[57] ABSTRACT

In order to determine the overall phase and amplitude distortion undergone by signals sent over a transmission channel, a pulse sequence generated at one end of the transmission channel is received at its other end at a first and a second input of a measuring instrument including, downstream of a receiving stage connected to the second input, regenerating circuitry for producing replicas of the original pulses. The latter are fed, along with the received distorted pulses, to a phase and amplitude comparator working into a spectral analyzer which displays the spectral-density difference between a received pulse and a replica of the corresponding transmitted pulse. The second input of the instrument may be connected to the output side or to the input side of an equalizer which supplies the received pulses to the first input thereof and whose parameters are to be adjusted on the basis of the measurements made.

11 Claims, 5 Drawing Figures

ELECTRONIC INSTRUMENT FOR MEASURING THE OVERALL PHASE AND AMPLITUDE DISTORTION OF A TRANSMISSION CHANNEL

FIELD OF THE INVENTION

Our present invention relates to electronic measuring instruments and in particular to an instrument for measuring the overall amplitude and phase distortion at a far end of a transmission channel.

BACKGROUND OF THE INVENTION

The knowledge of the overall amplitude and phase distortion of a far end of a transmission channel is particularly important to adjust the equalizers placed at the ends of a transmission line, especially when regenerating devices are not provided, i.e. when an analog transmission channel is involved.

A classical method used to obtain the phase distortion is that of making a group-delay measurement.

A frequency-swept and amplitude-modulated or phase-modulated signal is sent onto the channel and the modulating signal, which is constant neither in amplitude nor in phase, is extracted from the received signal at the channel end. The amplitude variation is a function of the amplitude distortion whereas the phase variation is a function of the group delay. Phase distortion can be determined from these values by reprocessing the measurements. However, such operations, basically consisting of a series of integrations, make the measurements slower and more complicated. In addition, a compact-enough instrument, endowed with suitable bandwidth, measurement processing and display capability and easy to use outside the laboratory, is seldom found.

SUMMARY OF THE INVENTION

These disadvantages are overcome with a measuring instrument for the overall amplitude and phase distortion at the far end of a transmission channel, as provided by the present invention, which allows the results of a comparison between the spectrum of the reference signal and that of the phase-distorted and amplitude-distorted signal to be displayed on the screen of a conventional spectrum analyzer, thus obtaining suitable sensitivity, measuring accuracy and use simplicity.

The present invention provides a measuring instrument of the overall amplitude and phase distortion at the far ends of a transmission channel, which at one channel end comprises a recurrent test-pulse generator of adjustable duration and repetition frequency pulses and at the other end a circuit having regenerating circuitry for reproducing replicas of the test pulses and spectrum analyzing means and composed of:
- a chain of stages adapted to extract the repetition frequency of said pulses;
- a phase-lock-loop circuit capable of generating a signal at a first frequency, based on the signal received from said chain of stages, and composed of a phase comparator, a controlled oscillator and a first programmable divider;
- a second programmable divider, which is preset to an initial value by an end-of-counting pulse generated by said first divider, presents the same division modulus as said first divider and receives at the input the signal generated by said controlled oscillator, said initial value being entered by a hand-operated control;
- a pulse shaper for making the signal generated by said second programmable divider equal to the pulses supplied by said pulse generator; and
- a comparison circuit for supplying the vector difference between the signal received from the transmission channel and the pulses supplied by said pulse shaper, the overall phase and amplitude distortion being obtained by displaying said vector difference on a spectrum analyzer.

SPECIFIC DESCRIPTION

The measurement method provided by the invention is not based on a direct distortion measurement, but rather on a comparison of the signal outgoing from the channel with a reference signal generated in the same way at the receiving and at the transmitting sides.

Figure 1:
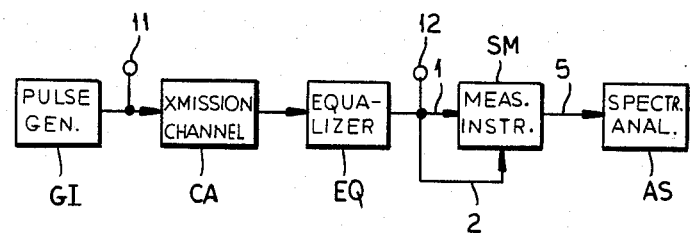
FIG. 1 is a general block diagram of the instrument according to the invention and of the transmission channel.

FIG. 1 is a block diagram, comprising a pulse generator GI, a transmission channel CA, an amplitude and phase equalizer EQ, the receiving part of a measuring instrument SM and a spectrum analyzer AS.

Generator GI sends onto the channel CA under measurement a pulse signal with a low and definite duty-cycle, i.e. recurrent test pulses. Practically, the signal consists of a train of pulses with determined duration and repetition frequency.

As is known, the spectrum associated with this signal present a line distribution and the component frequencies are the pulse repetition frequency and its harmonics.

The harmonic amplitudes of the spectral lines are given by the function $(\sin x)/x$, having the first zero at a frequency corresponding to the pulse-duration inverse.

The pulse signal should meet the following requirements:
low duty-cycle, to reduce the amplitude distortion associated with the possible difference between the durations of the transmitted pulses and of those generated at the receiving side: a limitation can result from the difficulty of obtaining very short pulses; and
defined duty cycle to introduce a desired distortion of the $(\sin x)/x$ type.

The duty cycle must be such that the zero of $(\sin x)/x$ is not too near the band to be equalized and, of course, also not lie within the band itself.

By choosing for the test pulses a duration equal to that fixed for the digital transmission system which will be used (in case of an 8-Mbit/s system the above duration is about 125 ns), the channel can be re-equalized by recovering also the amplitude distortion associated with the data-stream generation.

The test-pulse repetition frequency is chosen on the one hand to obtain an overall line delay, between the points in which the equalization is effected (equal to a whole number of complete cycles between a harmonic and the next, once the equalization has been carried out), and on the other hand on the basis of the characteristics of the phase equalizer used for the channel alignment. In fact, it is useful to provide several harmonics of the signal sent for the measurement in the frequency range within which each correction element of the equalizer operates.

While effecting the equalization, the pulse-repetition frequency value is to be varied with continuity around its nominal value so as to obtain a whole number of complete cycles, as mentioned above.

The measuring instrument SM regenerates at the receiving side a train of pulses at a frequency equal to that of pulses sent at the transmitting side.

The duration of the pulse signal regenerated at the receiving side is chosen so as to get a line spectrum approximately uniform over the whole band of interest or, in particular, a duty cycle equal to that of the transmitted pulse signal.

In the embodiment represented in FIG. 1, both the information for regenerating the reference pulses and the signal received from the transmission channel CA are extracted at the output of the equalizer EQ.

The phase and amplitude comparisons between the two spectral densities, one relating to the received signal and the other relating to pulses regenerated at the receiving side of the measuring instrument SM, give the information useful to the adjustment of the phase and amplitude equalizer, in order to reduce the channel distortion within the limits required by the transmission system to be installed.

The comparison is made by a vector-difference operation performed on the above-mentioned spectra. The displaying on the screen of the spectrum analyzer AS of the residual spectrum density, generated by the comparison operation, gives a general view of the residual distortion degree on the whole frequency band involved.

That is expressed, line by line, as the modulus of the difference between the two vectors (desired and obtained respectively) compared with the amplitude of one of the two spectra, used for calibration.

For instance, a 40-dB ratio for a line denotes that the difference modulus is 1% of the amplitude of that line pertaining to the spectrum displayed during the calibration.

Figure 2:
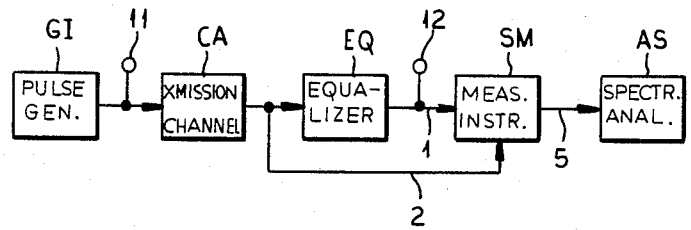
FIG. 2 is a second general block diagram of the instrument and of the channel.

FIG. 2 is a second block diagram in which the measuring instrument SM extracts the information capable of regenerating the reference pulses upstream of equalizer EQ, via lead 2, and the signal distorted by the transmission channel downstream of equalizer EQ via lead 1.

In fact, in a number of cases it may be convenient to have a signal for regenerating the comparison spectrum independent of possible equaliziang operations effected during the measurements on the transmission channel.

Figure 3:
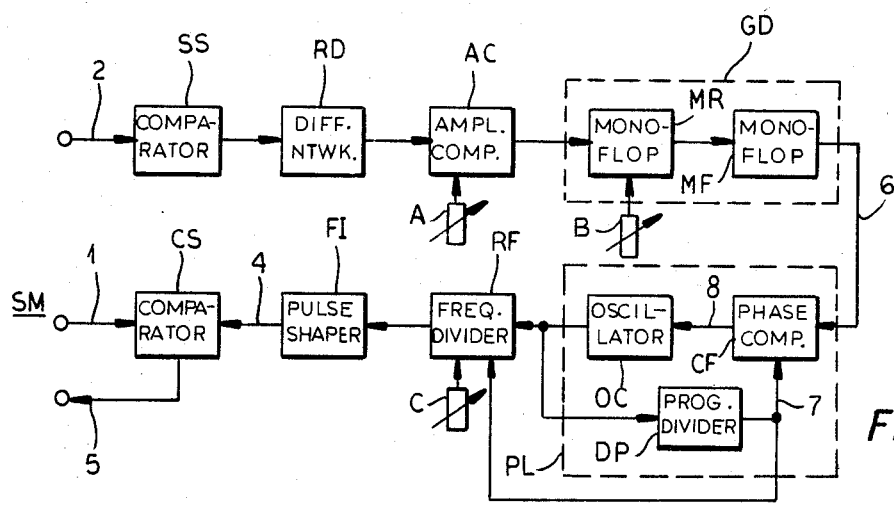
FIG. 3 is a block diagram of the receiving side of the instrument.

FIG. 3 is a block diagram of the receiving side of the measuring instrument SM, which regenerates the transmitted pulse according to the received information, even if distorted, and compares it with the reference pulses regenerated in this way.

The instrument SM is usable in the diagrams of FIGS. 1 and 2.

As the instrument must present a suitable input impedance within the band of the input signal coming via lead 2 from the channel to be equalized, the information useful to the generation of the sequence of pulses transmitted is picked up by an input-separating stage SS.

This supplies at the output the desired information on a low impedance without affecting, owing to its high input impedance, the signal directed toward comparison device CS.

Other arrangements are possible by using e.g. a resistance divider or a hybrid transformer.

The signal thus obtained is supplied to the subsequent stages which are to extract the transmitted pulse-repetition frequency.

For this purpose, the signal outgoing from the separating stage SS is sent to a differentiating network RD and then to an amplitude comparator AC, in which it is squared. This comparator is provided with a hand-operated control A for adjusting the comparison threshold.

In this way positive pulses of a level compatible with the logic levels are obtained, which are characterized by a repetition frequency equal to the transmitted one. A subsequent stage GD, composed of two cascaded monostable circuits MR and MF, allows the information relating to the repetition frequency to be supplied to the following phase-lock-loop oscillating circuit PL and the phase to be conveniently adjusted.

The first monostable circuit MR in fact operates as a variable delay element thanks to the adjustment of the duration of the pulse supplied at the output, by which the second monostable circuit MF is controlled.

This function is useful to the phase alignment of the two pulses, one being received from the channel and the other being locally generated.

In fact, the locally generated pulses can be delayed by the already-mentioned circuit MR by a continuous adjustment, effected by a control B, but with a limited range, and by a discrete adjustment including the whole repetition-frequency period.

This second adjustment will be described in greater detail hereinafter.

The second monostable circuit MF is on the contrary to generate the repetition frequency of the pulses transmitted as square waves, as the pulse duration corresponds to half the repetition period of the received pulses.

The subsequent phase-lock-loop oscillator PL allows the regeneration at the receiving side of the frequency used at the transmitting side, in order to reproduce a pulse sequence having the same characteristics as the transmitted one.

As usual, circuit PL is composed of a controlled oscillator OC, of a programmable divider DP and of a phase comparator CF, which receives the signal supplied by stage GD on wire 6 and the signal supplied by divider DP on wire 7, and supplies the control voltage to oscillator OC on wire 8.

To allow a phase adjustment ranging within the whole pulse-repetition period, the signal generated by circuit PL is sent to a circuit RF, consisting of a second division chain, programmable by a control C. In particular, the division moduli of divider DP and circuit RF are equal and the end-of-counting pulse generated by divider DP on wire 7 presets the divider of circuit RF to the initial value set by control C. The phase of the end-of-counting pulse generated by circuit RF can then be chosen among discrete values by means of a different binary word.

A circuit FI comes next, which is to shape the locally generated pulse. This shaping circuit is capable of rendering the level and transition edges of the pulse similar to those of the original pulse.

Figure 5:
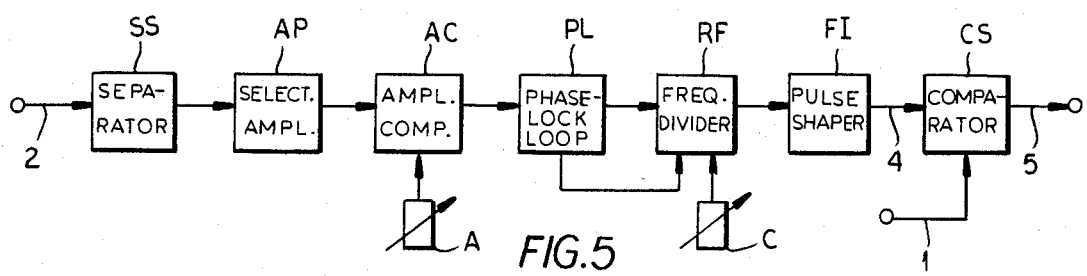
FIG. 5 is a block diagram of an alternative embodiment.

An alternative embodiment, according to the block diagram of FIG. 5, provides the use of a selective amplifier AP, tuned to the frequency of the first spectral line of the received spectrum, in replacement of the differentiating network RD.

The amplitude comparator AC allows the amplified sinusoidal signal to be converted into a square wave of a convenient level. Hence, it can be directly supplied to the phase comparator CF of the circuit PL, without using stage GD.

In both embodiments of the instrument, circuit CS makes the amplitude and phase comparison of two spectral densities, one relating to the signal received from the transmission channel on wire 1 and the other relating to the pulse regenerated at the receiving side on wire 4, and supplies at the output on wire 5 the spectral-density difference.

The use of spectrum analyzer AS allows an easy minimization of this difference and offers an immediate view of the result of the phase and amplitude equalizer adjustment.

Figure 4:
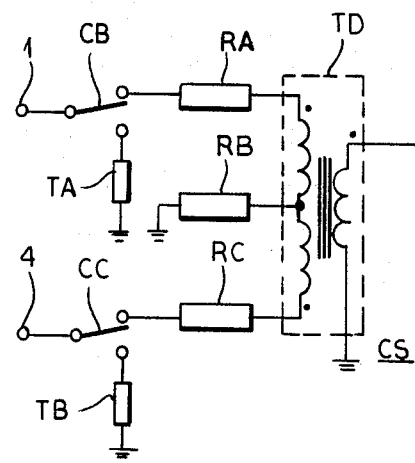
FIG. 4 is a detailed scheme of the block denoted by CS in FIG. 3.

A possible embodiment of the circuit CS is shown in FIG. 4.

Wires 1 and 4, on which there are present the received signal and the regenerated pulses, are connected to the mobile contacts of two switches CB and CC, whose fixed contacts are connected to matched loads TA and TB and to decoupling networks RA and RC. These networks are in turn connected to the primary winding of a differential transformer TD.

A further decoupling network RB, connected between the center tap of primary winding and the common ground, improves the decoupling between the inputs.

The secondary winding is connected to the output via wire 5.

By placing one of the two switches CB or CC in contact with one of the matched loads TA or TB, at the output one of the two input signals is obtained by which the analyzer connected to wire 5 may be calibrated.

Operating the switches so as to re-establish both the connections to transformer TD, the difference is obtained on wire 5, and on the analyzer screen an exact value of the overall distortion is displayed.

We claim:

1. A combination for the measurement of distortions of signals being transmitted over a channel comprising:
   a generator of recurrent test pulses connected to said channel at one end thereof;
   an equalizer, coupled to said channel, to be adjusted on the basis of said detected differences;
   an instrument for the measurement of distortions having a first and a second input connected to said equalizer at the other end thereof, said instrument comprising regenerating circuitry connected to said second input for producing replicas of the undistorted test pulses and comparison means connected to said regenerating circuitry and to said first input for detecting phase and amplitude differences between said replicas and corresponding distorted test pulses received over said channel; and
   spectrum-analyzing means connected to said comparison means for displaying the detected differences over a range of frequencies.

2. The device defined in claim 1 wherein said second input is connected to said channel upstream of said equalizer.

3. The combination defined in claim 1 wherein said regenerating circuitry comprises a phase-lock loop including an oscillator, a phase comparator connected between said second input and a control input of said oscillator, and a first frequency divider in a feedback path extending from said oscillator to said phase comparator, further comprising a second frequency divider connected in parallel with said first frequency divider to said oscillator and correlated with said first frequency divider to operate at the same step-down ratio as the latter.

4. The combination defined in claim 3 wherein said regenerating circuitry further comprises a repetition-frequency detector connected to said second input, an amplitude comparator with an adjustable threshold inserted between said detector and said phase comparator, and a pulse shaper interposed between said second frequency divider and said comparison means.

5. The combination defined in claim 4 wherein said detector is preceded by a signal separator.

6. The combination defined in claim 4 wherein said detector comprises a differentiation network, further comprising pulse-reconstituting means inserted between said amplitude comparator and said phase comparator.

7. The combination defined in claim 6 wherein said pulse-reconstituting means comprises a first monoflop triggerable with an adjustable delay by said differentiation network and a second monoflop in cascade with said first monoflop for emitting locally generated pulses of predetermined duration.

8. The combination defined in claim 4 wherein said detector comprises a selective amplifier responsive to the fundamental recurrence frequency of the received pulses for emitting a sine wave with said fundamental frequency to said amplitude comparator.

9. The combination defined in claim 1 wherein said comparison means comprises a hybrid transformer with a split primary winding having terminals respectively connected to said regenerating circuitry and said first input, the detected differences being available on a secondary winding of said hybrid transformer.

10. The combination defined in claim 9 wherein said primary winding has a center tap connected to a point of fixed potential.

11. A method of measuring phase and amplitude distortions incurred by signals over a channel of a communication system, comprising the steps of:
   (a) transmitting a series of recurrent test pulses from one end of said channel to the other end thereof;
   (b) receiving distorted pulses from said other end;
   (c) extracting the recurrence frequency of said test pulses from said distorted pulses;
   (d) regenerating replicas of said test pulses from the recurrence frequency extracted at said other end;
   (e) comparing each of said replicas with the corresponding distorted pulse to determine phase and amplitude differences between them; and
   (f) displaying the detected differences over a range of frequencies.

* * * * *